United States Patent
Wu et al.

(10) Patent No.: US 10,121,653 B2
(45) Date of Patent: Nov. 6, 2018

(54) BOTTOM-UP PEALD PROCES

(71) Applicant: Taiwan Semiconductor Manufacturing Co., Ltd., Hsin-Chu (TW)

(72) Inventors: Lin-Jung Wu, Miaoli (TW); Su-Horng Lin, Hsinchu (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 12 days.

(21) Appl. No.: 14/861,441

(22) Filed: Sep. 22, 2015

(65) Prior Publication Data
US 2016/0013043 A1 Jan. 14, 2016

Related U.S. Application Data

(62) Division of application No. 13/762,547, filed on Feb. 8, 2013, now Pat. No. 9,184,045.

(51) Int. Cl.
*H01L 21/00* (2006.01)
*H01L 21/02* (2006.01)
(Continued)

(52) U.S. Cl.
CPC ........ *H01L 21/0228* (2013.01); *C23C 16/045* (2013.01); *C23C 16/45542* (2013.01);
(Continued)

(58) Field of Classification Search
CPC ......... H01L 21/02274; H01L 21/28556; H01L 37/32926; H01L 37/32706; H01L 21/0228;
(Continued)

(56) References Cited

U.S. PATENT DOCUMENTS 5,449,432 A 9/1995 Hanawa
5,696,428 A 12/1997 Pasch
(Continued)

OTHER PUBLICATIONS

W.M.M. Kessles, et al.; "Introduction to (plasma-enhanced) Atomic Layer Deposition"; Department of Applied Physics, Eindhoven University of Technology, Jun. 15, 2009, p. 1.
(Continued)

*Primary Examiner* — Richard Booth
(74) *Attorney, Agent, or Firm* — Eschweiler & Potashnik, LLC (57) ABSTRACT

The present disclosure relates to a method and apparatus for performing a plasma enhanced ALD (PEALD) process that provides for improved step coverage. The process introduces a precursor gas into a processing chamber comprising a semiconductor workpiece. The first gas is ionized to form a plurality of ionized precursor molecules. A bias voltage is subsequently applied to the workpiece. The bias voltage attracts the ionized precursor molecules to the workpiece, so as to provide anisotropic coverage of the workpiece with the precursor gas. A reactant gas is introduced into the processing chamber. A plasma is subsequently ignited from the reactant gas, causing the reactant gas to react with the ionized precursor molecules that have been deposited onto the substrate to form a deposited layer on the workpiece.

20 Claims, 5 Drawing Sheets

(51) Int. Cl.
- *H01J 37/32* (2006.01)
- *C23C 16/04* (2006.01)
- *C23C 16/455* (2006.01)
- *H01L 21/285* (2006.01)
- *H01L 21/687* (2006.01)

(52) U.S. Cl.
CPC ......... *H01J 37/321* (2013.01); *H01J 37/3211* (2013.01); *H01J 37/32357* (2013.01); *H01J 37/32706* (2013.01); *H01J 37/32926* (2013.01); *H01L 21/02274* (2013.01); *H01L 21/28556* (2013.01); *H01L 21/687* (2013.01)

(58) Field of Classification Search
CPC ... H01L 21/687; H01J 37/3211; H01J 37/321; H01J 37/32357; H01J 37/32706; H01J 37/32926
See application file for complete search history.

(56) References Cited

U.S. PATENT DOCUMENTS

| | | | |
|---|---|---|---|
| 5,916,455 | A | 6/1999 | Kumagai |
| 6,024,826 | A | 2/2000 | Collins et al. |
| 6,563,110 | B1 | 5/2003 | Leri |
| 7,137,354 | B2 | 11/2006 | Collins et al. |
| 7,137,574 | B2 | 11/2006 | Grier et al. |
| 7,348,042 | B2 * | 3/2008 | Chiang .............. C23C 16/45525 427/252 |
| 7,740,705 | B2 | 6/2010 | Li |
| 8,053,372 | B1 * | 11/2011 | Greer ................. C23C 16/45523 427/255.23 |
| 2006/0211224 | A1 | 9/2006 | Matsuda |

OTHER PUBLICATIONS

Ki Myoung Yun, et al.; "Effect of X-ray Energy and Ionization Time on the Charging Performance and Nanoparticle Formation of a Soft X-ray Photoionization Charger"; Advanced Powder Technology 20 (2009) 529-536.

I. Suzuki, et al.; "Extra Low-Temperature SiO2 Deposition Using Aminosilanes"; Air Liquide Laboratories, Japan, 2007, p. 1-10.

Office Action dated Jul. 30, 2014 KR Patent Application No. 10-2013-0067795.

Non-Final Office Action dated Jun. 19, 2014 for U.S. Appl. No. 13/762,547.

Final Office Action dated Mar. 23, 2015 for U.S. Appl. No. 13/762,547.

Notice of Allowance dated Jul. 7, 2015 for U.S. Appl. No. 13/762,547.

* cited by examiner

BOTTOM-UP PEALD PROCES

REFERENCE TO RELATED APPLICATION

This Application is a Divisional of U.S. application Ser. No. 13/762,547 filed on Feb. 8, 2013, the contents of which are incorporated by reference in their entirety.

BACKGROUND

Integrated chips are formed by operating upon a semiconductor workpiece with a plurality of different processing steps. In general, the processing steps may include lithographic patterning to selectively mask one or more areas of a workpiece (e.g., a semiconductor substrate), implantations to modify electrical properties of a workpiece, etches to remove portions of a workpiece, and depositions to form one or more layers on a workpiece.

Deposition processes are widely used on varying surface topologies in both front-end-of-the-line (FEOL) and back-end-of-the-line (BEOL) processing. For example, in FEOL processing deposition processes may be used to form polysilicon material on a substantially flat substrate, while in BEOL processing deposition processes may be used to form metal layers within a cavity in a dielectric layer. Deposition processes may be performed by a wide range of deposition tools, including physical vapor deposition (PVD) tools, chemical vapor deposition (CVD) tools, atomic layer deposition (ALD) tools, etc.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

An atomic layer deposition (ALD) process is a layer-by-layer process for the deposition of films. An ALD process uses a precursor gas and a reactant gas to deposit a film on a substrate housed within a processing chamber. For example, a precursor gas may be used to deposit precursor molecules onto the substrate, after which a reactant gas may be brought into contact with precursor molecules on the substrate. Heat within the processing chamber causes the reactant gas to react with the precursor molecules to form a film on the substrate. While ALD processes provide for good step coverage, depositions by way of ALD have a low throughput that limits their use.

A physical vapor deposition (PVD) process is a physical process that deposits thin films onto a substrate by vaporizing a material, transporting the vaporized material to the substrate, and condensing the material on the substrate to form a film. While PVD processes provide for a higher throughput than ALD processes, depositions by way of PVD processes have poor step coverage.

Figure 1:
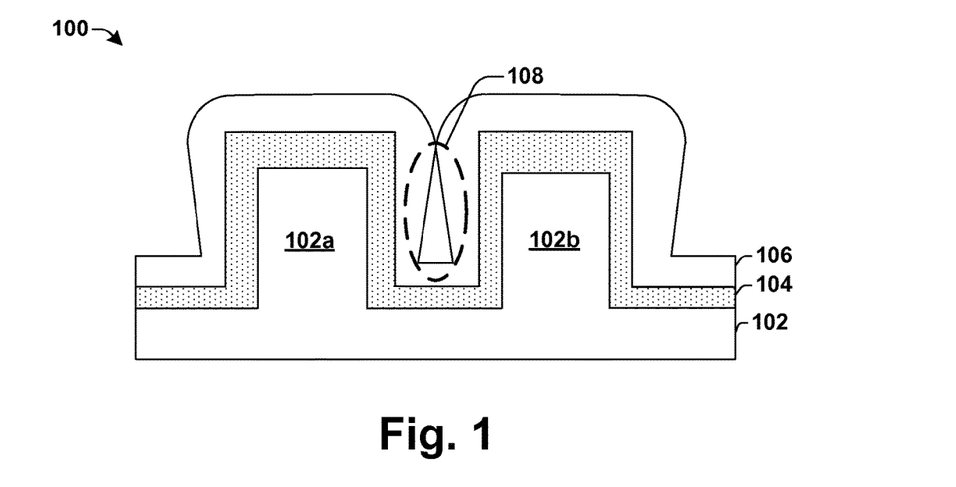
FIG. 1 illustrates a cross-sectional view of a substrate having a layer deposited by an atomic layer deposition (ALD) and a physical vapor deposition (PVD), sequentially processed.

Typically, a number of different deposition processes may be used during fabrication of an integrated chip. For example, FIG. 1 illustrates a cross-sectional view 100 of a semiconductor substrate upon which an ALD and PVD processes have been carried out sequentially. As shown in cross-sectional view 100, a first layer 104 is formed by ALD process on a semiconductor substrate 102 having a plurality of steps, 102a and 102b, comprising a large height-to-width aspect ratio. The first layer 104 has a good uniformity that provides for good step coverage. A second layer 106 is formed by a PVD process above the first layer 104. The aspect ratio of the steps, 102a and 102b, causes the second layer 106 to provide for poor step coverage on sidewalls of the steps, 102a and 102b. The poor step coverage may result in a void 108 in the second layer 106 that can be detrimental to integrated chip operation.

Plasma enhanced ALD, or PEALD, is a deposition process that can be used to provide for improved step coverage over PVD processes and higher throughput than ALD processes. PEALD processes make use of an RF-plasma (e.g., precursor and reactant gases do not react with each other without plasma activation) to enable higher deposition rates and improved film electrical properties at lower temperatures when compared to ALD processes.

The present invention relates to a plasma enhanced ALD (PEALD) process that provides a bottom-up process having improved gap-fill capability. In some embodiments, the disclosed PEALD process comprises introducing a precursor gas into a processing chamber comprising a semiconductor workpiece (i.e., semiconductor substrate). The precursor gas is ionized to form a plurality of ionized precursor molecules. A bias voltage is subsequently applied to the workpiece. The bias voltage attracts the ionized precursor molecules to the workpiece, so as to provide anisotropic coverage of the substrate with precursor gas molecules. A reactant gas is introduced into the processing chamber. A plasma is subsequently ignited from the reactant gas, causing the reactant gas to react with the ionized precursor molecules that have been anisotropically deposited onto the substrate to form a deposited layer on the workpiece. By reacting the reactant gas with an anisotropically deposited precursor gas, a bottom-up film is formed on the workpiece.

Figure 2:
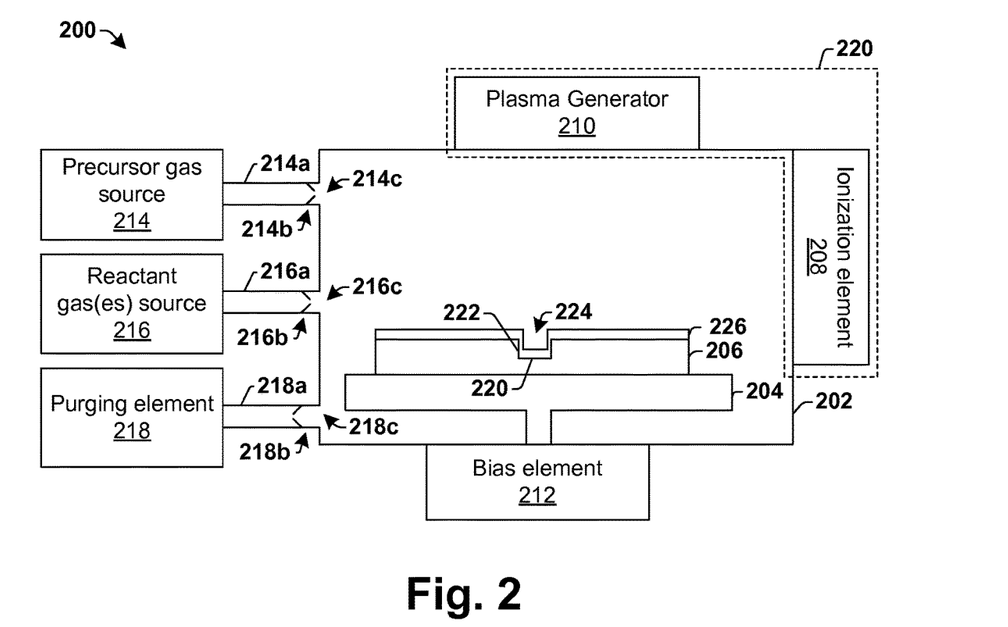
FIG. 2 illustrates a block diagram of some embodiments of a disclosed PEALD system.

FIG. 2 illustrates a block diagram of some embodiments of a disclosed plasma enhanced ALD (PEALD) system 200.

The PEALD system 200 comprises a processing chamber 202 configured to house a semiconductor workpiece 206 (e.g., a silicon substrate). In some embodiments, the processing chamber 202 comprises a wafer chuck 204 configured to hold the semiconductor workpiece 206.

A precursor gas source 214 is coupled to the processing chamber 202 by way of first conduit 214a. The first conduit 214a may be configured to selectively provide a precursor gas to a precursor gas inlet 214c in the processing chamber 202, based upon operation of a first valve 214b. A reactant gas source 216 is coupled to the processing chamber 202 by way of a second conduit 216a. The second conduit 216a may be configured to selectively provide a reactant gas to a reactant gas inlet 216c in the processing chamber 202, based upon operation of a second valve 216b. It will be appreciated that the term 'valve', as provided herein, is not limited to a certain physical or mechanical structure but rather refers to any element that controls the flow of gas to the processing chamber 202.

An ionizing component 220 is in communication with the processing chamber 202. The ionizing component 220 is configured to ionize gas molecules within the processing chamber 202. In some embodiments, the ionizing component 220 selectively operates to ionize precursor gas molecules and reactant gas molecules within the processing chamber 202 at different times.

In some embodiments, the ionizing component 220 comprises an ionization element 208 configured to ionize neutral molecules of a precursor gas within the processing chamber 202 by adding or removing a charged particle (e.g., an electron) to/from neutral gas molecules. The ionizing component 220 may ionize precursor gas molecules according to a variety of ways. In some embodiments, the ionization element 208 is configured to generate an electric field within the processing chamber 202. The electric field operates to ionize molecules of the precursor gas within the processing chamber 202 to generate a plasma comprising a plurality of ionized molecules. In some other embodiments, the ionization element 208 comprises an irradiant unit configured to generate an ionizing radiation that ionizes precursor gas molecules.

In some embodiments, the ionizing component 220 further comprises a plasma generator 210 configured to ignite a plasma from the reactant gas to trigger a reaction between precursor gas molecules that have deposited onto the semiconductor workpiece 206 and the reactant gas. The reaction forms an anisotropic deposited layer 226 on the semiconductor workpiece 206. In some embodiments, the plasma generator 210 may comprise a radio frequency (RF) powered inductively coupled plasma source configured to generate an RF plasma within the processing chamber 202. In various embodiments, the plasma generator 210 may be configured to ignite a direct plasma within the processing chamber 202 or to ignite an indirect plasma at a location remote from the processing chamber 202.

A bias element 212 is electrically connected to the semiconductor workpiece 206. The bias element 212 is configured to selectively apply a bias voltage to the workpiece 206. In some embodiments, the bias element 212 is configured to apply a pulsed bias voltage that varies between a first voltage value and a second voltage value as a function of time. For example, in some embodiments, the bias element 212 is configured to apply a bias voltage, having a value in the range of between approximately 0 V and approximately −200V, to the semiconductor workpiece 206. By concurrently operating the bias element 212 and the ionization element 208, ionized molecules of the precursor gas are attracted to semiconductor workpiece 206 with a downward force in the direction of the semiconductor workpiece 206. The downward force, in addition to diffusion-absorption, causes an anisotropic deposition of precursor gas molecules onto the semiconductor workpiece 206 that allows formation of the anisotropic deposited layer 226 in a bottom-up deposition process that provides for improved step coverage.

For example, the anisotropically deposited precursor molecules accumulate to a greater thickness on a bottom surface 220 of a cavity 224 within the semiconductor workpiece 206 than on sidewalls 222 of the cavity 224. The greater thickness of precursor molecules on a bottom surface 220 of the cavity causes the cavity 224 to be filled upward from the bottom surface 220 in a bottom-up deposition process. The bottom-up deposition process improves gap fill and reduces voids in a deposited layer.

It will be appreciated that the disclosed PEALD system 200 is not limited to forming a deposited layer 226 having a single monolayer. Rather, the disclosed PEALD system 200 may form a deposited layer 226 comprising multiple monolayers. For example, the disclosed PEALD system 200 may form a deposited layer 226 that is multiple atoms thick on the top and bottom surfaces, while it form a thinner deposited layer (e.g., a deposited layer 226 a single atom thick) on the sidewalls of a step.

In some embodiments, the PEALD system 200 further comprises a purging element 218 configured to purge the processing chamber 202. The purging element 218 may be connected to the processing chamber 202 by way of a third conduit 218a comprising a third valve 218b. The third conduit 218a is configured to introduce a purging gas to the processing chamber 202 by way of a purging outlet 218c. The purging gas evacuates other gases from the processing chamber 202. For example, the purging element 218 may purge the precursor gas and/or the reactant gas from the processing chamber 202.

Figure 3A:
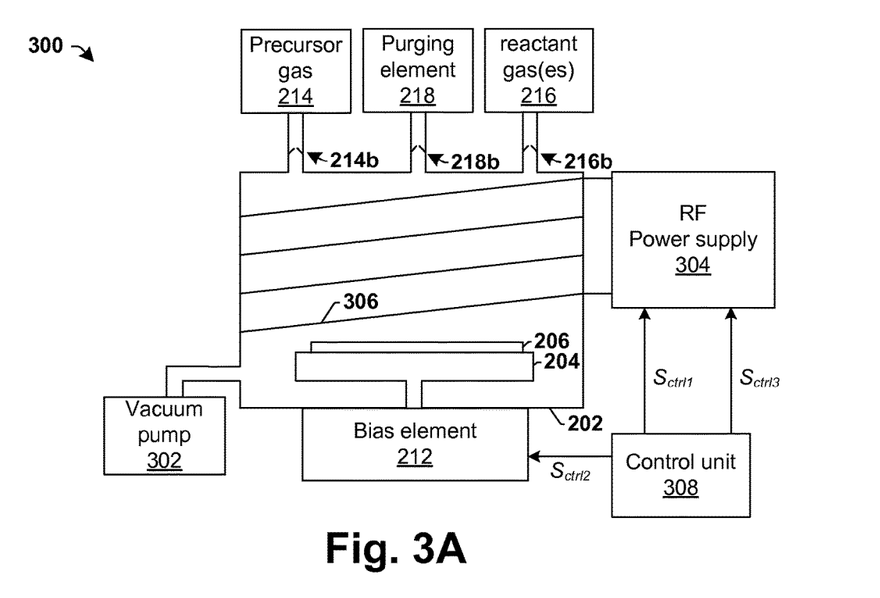
FIG. 3A illustrates a block diagram of some alternative embodiments of a disclosed PEALD system.

FIG. 3A illustrates a block diagram of some alternative embodiments of a disclosed PEALD system 300.

As shown in PEALD system 300, the processing chamber 202 comprises a vacuum chamber connected to a vacuum pump 302 (e.g., a turbo pump). The vacuum pump 302 is configured to generate a low pressure within the processing chamber 202.

PEALD system 300 has an ionizing component comprising an RF power supply 304 and an RF antenna 306. The RF power supply 304 is configured to generate an RF signal operating at a set frequency (e.g., 13.56 MHz), which transfers energy from the RF power supply 304, via the RF antenna 306, to a gas within the processing chamber 202. When sufficient power has been delivered to the gas, a plasma is ignited. In some embodiments, the RF power supply 304 may comprise a matching network configured to match the output impedance of the RF power supply 304 to a complex impedance established by the RF antenna 306 and a plasma load (i.e., impedance), thereby efficiently coupling power from the RF signal, generated by the RF power supply 304, into a plasma within the processing chamber 202.

In some embodiments, the RF antenna 306 may comprise a conductive coil, formed from a conductive wire, which extends from the RF power supply 304 to a position operatively coupled to processing chamber 202. In one embodiment, the conductive coil may be wrapped around an exterior of the processing chamber 202 for a plurality of n turns. In alternative embodiments, the conductive coil may be comprised within the interior of the processing chamber 202.

A control unit 308 is configured to control operation of one or more components of the PEALD system 300, so as to cause the PEALD system 300 to perform a PEALD process that anisotropically forms a deposited layer on a substrate. The control unit 308 is configured to sequentially control the flow of the reactant gas, the precursor gas, and the purge gas, as well as the operation of the RF power supply 304 (i.e., the ionization element and the plasma generator).

In some embodiments, control unit 308 is configured to send a first control signal $S_{ctrl1}$ to the RF power supply 304, a second control signal $S_{ctrl2}$ to the bias element 212, and a third control signal $S_{ctrl3}$ to the RF power supply 304. The first control signal $S_{ctrl1}$ causes the RF power supply 304 to selectively ionize the precursor gas during a first operating period. The second control signal $S_{ctrl2}$ causes the bias element 212 to apply the bias voltage to the semiconductor workpiece 206 during the first operating period. The third control signal $S_{ctrl3}$ causes the RF power supply 304 to ignite the plasma after the first operating period has ended. In additional embodiments, the control unit 308 may send additional control signals to other elements of the PEALD system 300 (e.g., purging element 218, first valve 214b, second valve 216b, etc.)

Figure 3B:
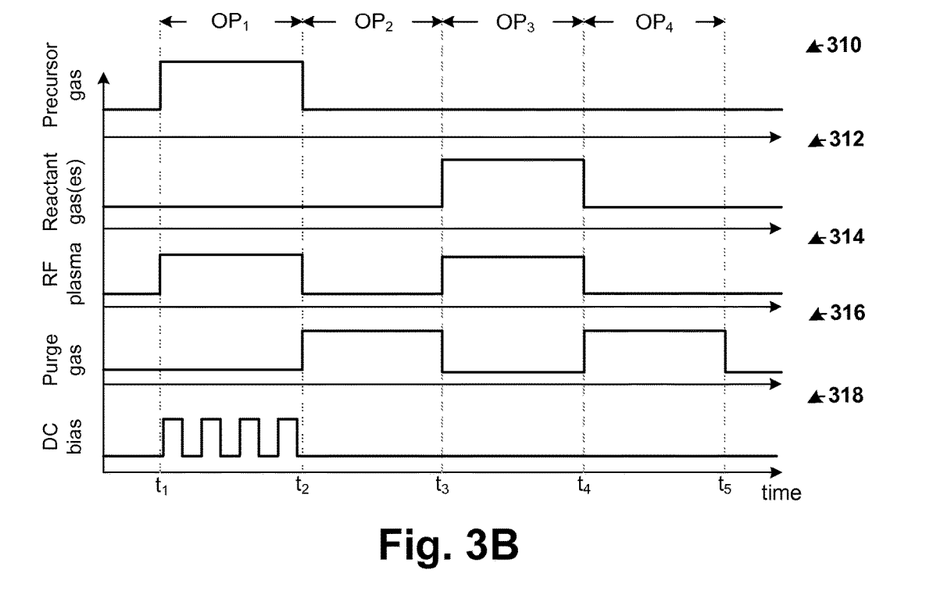
FIG. 3B illustrates a timing diagram of an exemplary operation of disclosed PEALD system of FIG. 3A.

FIG. 3B shows timing diagrams 310-318 illustrating an exemplary operation of the PEALD system 300 by control unit 308.

As shown in timing diagram 310, at a first time $t_1$ the control unit 308 operates to introduce a precursor gas into the processing chamber 202 by way of the precursor gas conduit. The control unit 308 causes the precursor gas to flow into the processing chamber 202 from the first time $t_1$ to a second time $t_2$.

During a first operating period (OP$_1$), present between the first time $t_1$ and the second time $t_2$, the control unit 308 further operates the RF power supply 304 to ionize the precursor gas to generate a plasma comprising a plurality of ionized precursor molecules within the processing chamber 202 (as shown in timing diagram 314). During the first operating period, the control unit 308 further operates the bias element 212 to apply a bias voltage, which varies between a first value and a second value, to the workpiece 206, as shown in timing diagram 318. The bias voltage causes ionized precursor molecules to be attracted to the workpiece 206 with a downward force. The downward force causes more ionized precursor molecules to be deposited onto horizontal surfaces (e.g., where accumulation of particles is due to the downward force and diffusion) of the workpiece 206 than on vertical surfaces of the workpiece 206 (e.g., where accumulation of particles is due to diffusion) providing for anisotropic coverage of precursor molecules on the workpiece 206.

At a second time $t_2$ (during OP$_2$), the control unit 308 turns off the precursor gas and operates the purging element 218 to introduce a purging gas that purges the residue of the precursor gas from the processing chamber 202, as shown in timing diagram 316.

During a third operating period (OP$_3$), present between a third time $t_3$ and a fourth time $t_4$, the control unit 308 operates to introduce a reactant gas into the processing chamber 202 by way of the reactant gas conduit, as shown in timing diagram 312. The control unit 308 causes the reactant gas to flow into the processing chamber 202 from the third time $t_3$ to the fourth time $t_4$.

During the third operating period, the control unit 308 further operates the plasma generator 210 to ignite a plasma (e.g., an RF plasma) from the reactant gas, as shown in timing diagram 314. The plasma causes the reactant gas to interact with the anisotropically deposited precursor gas molecules that had accumulated on the workpiece 206. The anisotropically deposited precursor gas molecules result in a bottom-up deposited layer on the workpiece 206 that is thinner along sidewalls of the workpiece 206 than on horizontal surfaces of the workpiece 206.

At a fourth time $t_4$ (during OP$_4$), the control unit 308 turns off the reactant gas and operates the purging element 218 to introduce a purging gas that purges the residue of the reactant gas from the processing chamber 202, as shown in timing diagram 316.

It will be appreciated that the precursor gas and the reactant gases may be chosen based upon a material to be deposited. In various embodiments, the deposited layer may comprise an oxide (e.g., $SiO_2$, $HfO_2$, $Al_2O_3$, etc.) or a metal (e.g., TiN, TaN, etc.). For example, to form deposited layer comprising a $SiO_2$ oxide, a silicon precursor (e.g., tetradimethyl-aminosilicon) and an oxide reactant gas may be used. Similarly, to form a deposited layer comprising $HfO_2$ a hafnium precursor (e.g., tetrakis(ethylmethylamino)hafnium) and a oxygen reactant gas may be used.

Figure 4:
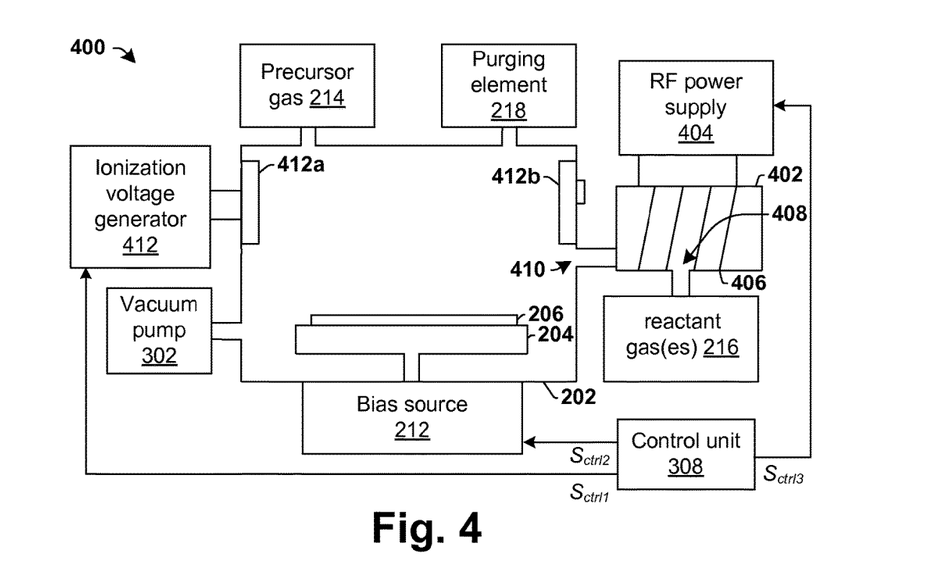
FIG. 4 illustrates a block diagram of some alternative embodiments of a disclosed PEALD system.

FIG. 4 illustrates a block diagram of some alternative embodiments of a disclosed PEALD system 400.

PEALD system 400 comprises a remote plasma generator configured to generate a plasma at a location remote from the processing chamber 202. The plasma is subsequently introduced into the processing chamber 202, by way of a remote plasma inlet 410.

In some embodiments, the remote plasma generator comprises a remote plasma chamber 402 configured to receive a reactant gas from a reactant gas source 216 by way of a reactant gas inlet 408. The remote plasma generator ignites a remote plasma based upon the reactant gas (e.g., by RF inductive plasma coupling, or microwave coupling). In some embodiments, the remote plasma generator comprises a RF power supply 404 configured to provide an RF signal to a conductive coil 406 wrapped around the remote plasma chamber 402.

PEALD system 400 further comprises an ionization element comprising an ionization voltage generator 412 electrically connected to an anode 412a and a cathode 412b positioned at varying locations with respect to the processing chamber 202. The ionization voltage generator 412 is configured to apply a large electric potential difference between anode 412a and cathode 412b. The large electric potential difference forms an electric field that permeates the processing chamber 202. The electric field operates to ionize molecules of the precursor gas to generate a plurality of ionized precursor molecules within the processing chamber 202.

A control unit 308 is configured to operate a bias element 212 and the ionization element (e.g., comprising ionization voltage generator 412) during a first operating period and to operate the plasma generator (e.g., comprising RF power supply 404) during a second operating period after the first operating period, to form an anisotropically deposited layer on the semiconductor workpiece 206.

Figure 5:
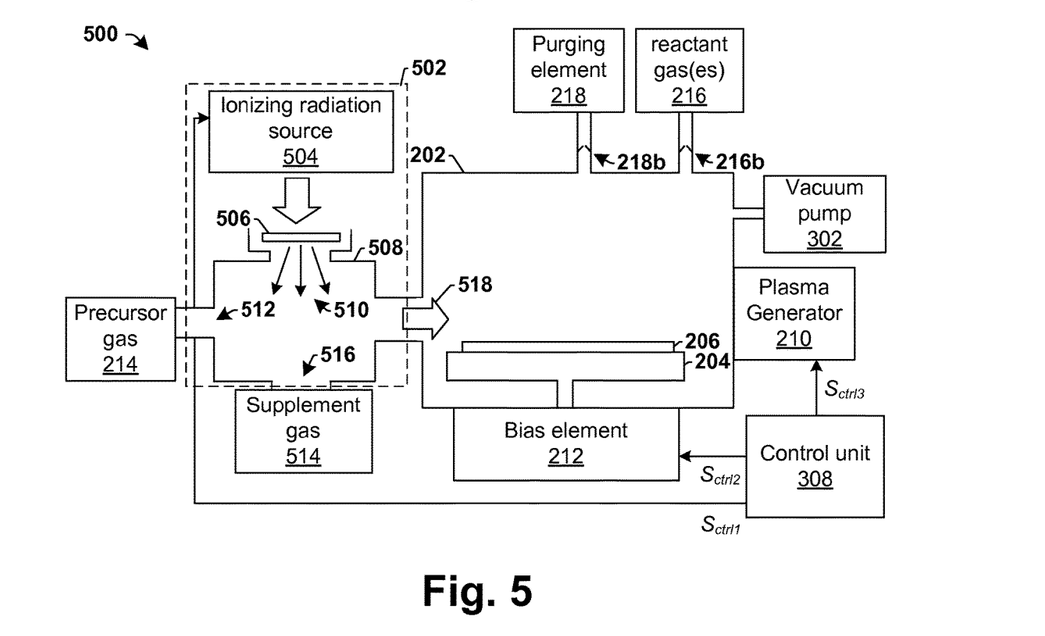
FIG. 5 illustrates a block diagram of some alternative embodiments of a disclosed PEALD system.

FIG. 5 illustrates a block diagram of some alternative embodiments of a disclosed PEALD system 500.

PEALD system 500 comprises a remote ionization element 502. The remote ionization element 502 is configured to ionize the precursor gas at a location upstream of the processing chamber 202 and to provide ionized precursor gas molecules to the processing chamber 202. The remote ionization element 502 may use a wide range of ionization techniques to ionize the precursor gas (i.e., to remove an electron from a precursor gas molecule). In some embodiments, the remote ionization element 502 may use laser pulses to ionize the precursor gas. In other embodiments, the remote ionization element 502 is configured to generate ionizing radiation (e.g., ultra-violet, x-ray, etc.), which has a sufficient energy to ionize precursor gas molecules (i.e., to remove an electron from a precursor gas molecule).

For example, in some embodiments, the remote ionization element 502 comprises an irradiation unit configured to ionize precursor as molecules. The irradiation unit comprises an ionizing radiation source 504 (e.g., a soft x-ray source, an ultraviolet radiation source, etc.) configured to generate ionizing radiation 510 (e.g., soft x-rays, UV radiation, etc.). The ionizing radiation source 504 is in communication with a cavity configured to house a transparent window 506. The ionizing radiation 510 traverses the transparent window 506 to enter into an ionization chamber 508. In some embodiments, the transparent window 506 may be comprised of a thin polymer film.

A pressurized precursor gas is provided from a precursor gas source 214 to the ionization chamber 508 by way of a pre-cursor gas inlet 512. In some embodiments, a supplemental gas may also be provided from a supplemental gas source 514 to the ionization chamber 508 by way of a supplemental gas inlet 516. In some embodiments, the supplemental gas may drawn into the ionization chamber 508 by a low-pressure area created by a velocity of the pressurized precursor gas flow into the ionization chamber 508. The supplemental gas is combined with the precursor gas to form a combined gas that is ionized by the ionizing radiation 510. The combined ionized gas 518 is provided from the ionization chamber 508 to the processing chamber 202.

Figure 6:
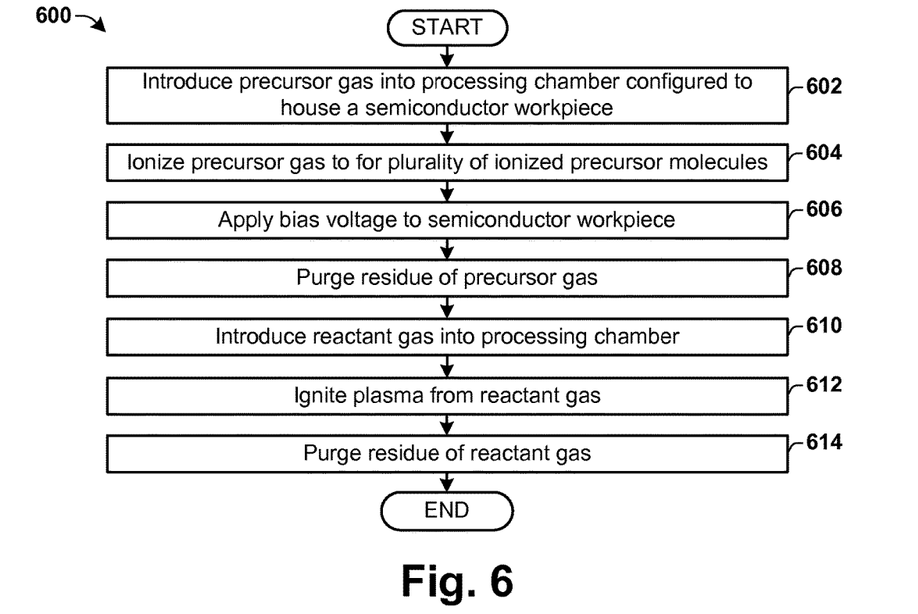
FIG. 6 is a flow diagram of some embodiments of a method of performing a PEALD process.

FIG. 6 is a flow diagram of some embodiments of a method 600 of performing a plasma enhanced ALD (PEALD) process.

While the disclosed method 600 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 602, a precursor gas is introduced into a processing chamber configured to house a semiconductor workpiece. In some embodiments, the precursor gas may comprise SAM24. In other embodiments, the precursor gas may comprise silicon, hafnium, or aluminum, for example.

At act 604, the precursor gas is ionized to form a plurality of ionized precursor molecules within the processing chamber.

At act 606, a bias voltage is applied to the semiconductor workpiece. In some embodiments, the bias voltage may comprise a pulsed DC bias having a first value and a second value. The first and second values may range between approximately 0 V and approximately −200V.

At act 608, a residue of the precursor gas may be purged from the processing chamber. Purging the residue of the precursor gas removes precursors that have not accumulated on the semiconductor workpiece from the processing chamber.

At act 610, a reactant gas is introduced into the processing chamber.

At act 612, a plasma is ignited within the processing chamber from the reactant gas. The plasma causes a reaction between the reactant gas and ionized precursor molecules that have accumulated on the semiconductor workpiece. The reaction results in an anisotropically deposited layer on the semiconductor workpiece.

In some embodiments, the plasma may be generated by RF inductive coupling to the reactant gas. In some embodiments, the RF plasma may comprise a direct plasma that is formed at a position within the processing chamber that is directly in contact with the substrate. In other embodiments, the RF plasma may comprise a remote plasma that is formed at a position that is separated from the substrate, and which is provided to the substrate At act 614, a residue of the reactant gas may be purged from the processing chamber. Purging the residue of the precursor gas removes non-reacted reactant gases (i.e., reactant gases that have not reacted with the precursor molecules on the semiconductor workpiece) and by-products of the reaction from the processing chamber.

Figure 7:
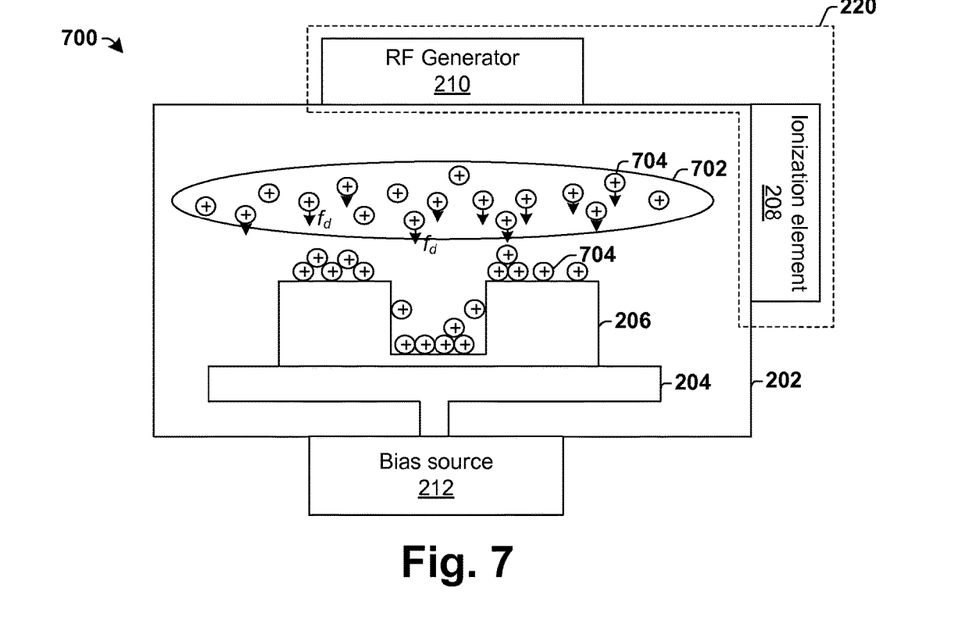
FIGS. 7-8 illustrate cross-sectional views of some embodiments of an integrated chip (IC) whereon a disclosed method of performing a PEALD process is implemented.
Figure 8:
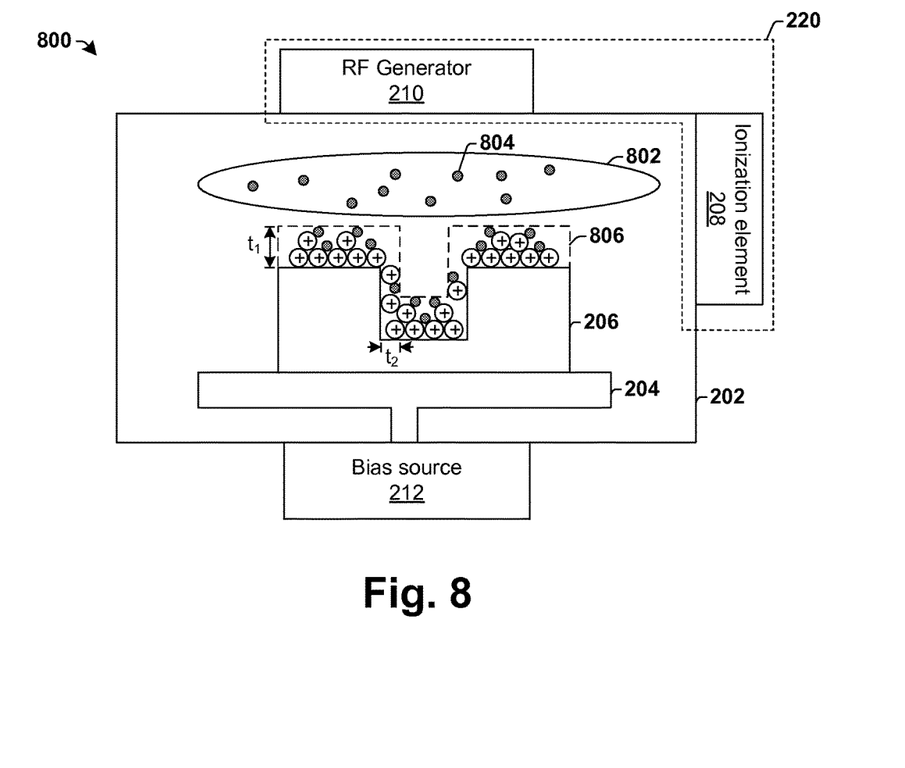

FIGS. 7-8 illustrate cross-sectional views of some embodiments of an integrated chip (IC) whereon a disclosed method of performing a PEALD process is implemented.

FIG. 7 illustrates some embodiments of a cross-sectional view 700 corresponding to act 602-606. As shown in cross-sectional view 700, a precursor gas 702 is introduced into the processing chamber 202 housing a semiconductor workpiece 206. The precursor gas 702 is ionized to form a plasma having a plurality of ionized precursor molecules 704. In various embodiments, the semiconductor workpiece 206 may comprise a surface topology having one or more steps.

A bias voltage applied to the semiconductor workpiece 206 causes the ionized precursor molecules 704 to be attracted to a semiconductor workpiece 206 with a downward force $f_d$ that causes ionized precursor molecules to be deposited in an anisotropic manner. For example, the ionized precursor molecules 704 accumulate more on horizontal surfaces of the semiconductor workpiece than on vertical sidewalls of the semiconductor workpiece 206.

FIG. 8 illustrates some embodiments of a cross-sectional view 800 corresponding to act 610-612. As shown in cross-sectional view 800, a reactant gas 802 is introduced into the processing chamber 202. A plasma having a plurality of ions is ignited from the reactant gas 802. The ions 804 of the plasma react with the precursor molecules 704 that have accumulated on the semiconductor workpiece 206 to form a deposited layer 806, which has a thickness $t_1$ on horizontal top/bottom surfaces of the semiconductor workpiece that is greater than a thickness $t_2$ on vertical sidewalls of the semiconductor workpiece 206. The greater thickness $t_1$ of the deposited layer 806 on horizontal top/bottom surfaces causes cavities in the semiconductor workpiece 206 to fill upward from the bottom, improving gap fill and reducing voids in the deposited layer 806

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Additionally, it will be appreciated that the term "anisotropic" as used herein denotes a directionality to the deposition, but does not preclude isotropic components of a deposition. For example, when a disclosed bias element applies a low bias voltage to the substrate, it provides for an "anisotropic" deposition having a larger degree of isotropy than when the disclosed bias element applies a higher bias voltage to the substrate.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method and apparatus for performing a plasma enhanced atomic layer deposition (PEALD) process that improves step coverage of a substrate.

In some embodiments, the present disclosure relates to a method of performing a plasma enhanced atomic layer deposition (PEALD) process. The method comprises introducing a precursor gas into a processing chamber having a semiconductor workpiece during a first time period, ionizing the precursor gas during a second time period, and applying a bias voltage to a wafer chuck during the second time period. The method further comprises introducing a reactant gas into the processing chamber at a third time period that does not overlap the first time period, and igniting a plasma from the reactant gas during the third time period.

In other embodiments, the present disclosure relates to a method of performing a PEALD process. The method comprises ionizing a precursor gas within a processing chamber during a first time period, and applying a bias voltage to a wafer chuck during the first time period. The method further comprises igniting a plasma within the processing chamber during a second time period that does not overlap the first time period.

In yet other embodiments, the present disclosure relates to a method of performing a PEALD process. The method comprises introducing a precursor gas into a processing chamber configured to house a semiconductor workpiece during a first time period, ionizing the precursor gas during the first time period, and biasing a wafer chuck to attract the ionized precursor gas to the semiconductor workpiece during the first time period. The method further comprises introducing a reactant gas into the processing chamber during a second time period that does not overlap the first time period, wherein the reactant gas interacts with the ionized precursor gas to form a deposited layer on the semiconductor workpiece.

What is claimed is:

1. A method of performing a plasma enhanced atomic layer deposition (PEALD) process, comprising:

introducing a precursor gas into a processing chamber configured to house a semiconductor workpiece during a first time period;
ionizing the precursor gas during the first time period;
applying a bias voltage to a wafer chuck during the ionization of the precursor gas, wherein the bias voltage attracts the ionized precursor gas to the semiconductor workpiece so as to cause the ionized precursor gas to accumulate on the semiconductor workpiece;
introducing a reactant gas that is different than the precursor gas into the processing chamber at a second time period that occurs after the first time period and that does not overlap the first time period; and
igniting a plasma from the reactant gas during the second time period, wherein the plasma is configured to react with the ionized precursor gas that has accumulated on the semiconductor workpiece to form a deposited layer on the semiconductor workpiece.

2. The method of claim 1,
wherein during the first time period the precursor gas in ionized using an RF power; and
wherein the RF power is reduced upon ending the introduction of the precursor gas into the processing chamber and increased upon introducing the reactant gas into the processing chamber.

3. The method of claim 1, further comprising:
purging a residue of the reactant gas from the processing chamber after the first time period.

4. The method of claim 1, wherein the second time period occurs after the ionization of the precursor gas has ceased.

5. The method of claim 1, wherein the bias voltage is not applied to the wafer chuck during the second time period.

6. The method of claim 1, wherein the deposited layer has a greater thickness on horizontally extending surfaces of the semiconductor workpiece than on vertically extending sidewalls of the semiconductor workpiece.

7. The method of claim 1, wherein the bias voltage comprises a pulsed bias voltage that alternates between a first value and a second value during the first time period.

8. The method of claim 7, wherein the pulsed bias voltage alternates between voltage values in a range of between approximately 0V and approximately −200V.

9. A method of performing a PEALD process, comprising:
ionizing a precursor gas within a processing chamber configured to hold a substrate during a first time period;
applying a bias voltage to a wafer chuck during the ionization of the precursor gas, wherein the bias voltage attracts the precursor gas to accumulate on the substrate;
igniting a plasma within the processing chamber from a reactant gas during a second time period that occurs after the ionization of the precursor gas has ceased and that does not overlap the first time period; and
wherein the plasma reacts with the precursor gas that has accumulated on the substrate to form a deposited layer having a greater thickness on horizontally extending surfaces of the substrate than on vertically extending sidewalls of the substrate.

10. The method of claim 9, further comprising:
purging a residue of the precursor gas from the processing chamber prior to introducing the reactant gas into the processing chamber; and
purging a residue of the reactant gas from the processing chamber after igniting the plasma.

11. The method of claim 9, wherein the plasma comprises a direct plasma generated within the processing chamber.

12. The method of claim 9, wherein the bias voltage is applied to a semiconductor workpiece concurrent to ionizing the precursor gas.

13. The method of claim 9, wherein the bias voltage is not applied to the wafer chuck during the second time period.

14. The method of claim 9, wherein the plasma comprises a direct plasma ignited within the processing chamber.

15. The method of claim 9, wherein the second time period begins at an end of the first time period.

16. A method of performing a PEALD process, comprising:
    introducing a precursor gas into a processing chamber configured to house a semiconductor workpiece during a first time period;
    applying an RF power to an RF antenna to ionize the precursor gas during the first time period, wherein the RF power is increased upon introducing the precursor gas into the processing chamber and decreased upon ending the introduction of the precursor gas into the processing chamber;
    biasing a wafer chuck to attract the ionized precursor gas to the semiconductor workpiece during the ionization of the precursor gas; and
    introducing a reactant gas into the processing chamber during a second time period that occurs after the ionization of the precursor gas has ceased and that does not overlap the first time period, wherein the reactant gas interacts with the ionized precursor gas to form a deposited layer on the semiconductor workpiece and the RF power is increased upon introducing the reactant gas into the processing chamber.

17. The method of claim 16, further comprising:
    purging a residue of the precursor gas from the processing chamber prior to introducing the reactant gas into the processing chamber.

18. The method of claim 16, further comprising:
    igniting a plasma from the reactant gas during the second time period.

19. The method of claim 18, wherein the plasma comprises a direct plasma ignited within the processing chamber.

20. The method of claim 1,
    wherein a first RF power is applied to an RF antenna to ionize the precursor gas during the first time period; and
    wherein the first RF power applied to the RF antenna is reduced upon ending the introduction of the precursor gas into the processing chamber.

* * * * *